United States Patent [19]

Sweatt

[11] Patent Number: 5,361,292
[45] Date of Patent: Nov. 1, 1994

[54] CONDENSER FOR ILLUMINATING A RING FIELD

[75] Inventor: William C. Sweatt, Albuquerque, N. Mex.

[73] Assignee: The United States of America as represented by the Department of Energy, Washington, D.C.

[21] Appl. No.: 60,335

[22] Filed: May 11, 1993

[51] Int. Cl.$^5$ .............................................. G21K 1/06
[52] U.S. Cl. ........................................ 378/34; 378/85; 359/851; 359/861
[58] Field of Search ..................... 378/34, 43, 84, 85; 359/851, 857, 859, 861, 869

[56] References Cited

U.S. PATENT DOCUMENTS

| | | | |
|---|---|---|---|
| 4,861,148 | 8/1989 | Sato et al. | 359/859 X |
| 5,063,586 | 11/1991 | Jewell et al. | 378/34 |
| 5,107,526 | 4/1992 | Hoover | 378/43 |
| 5,131,023 | 7/1992 | Yasugaki et al. | 378/43 |
| 5,136,413 | 8/1992 | MacDonald et al. | 359/869 X |
| 5,153,898 | 10/1992 | Suzuki et al. | 378/43 X |

Primary Examiner—David P. Porta
Attorney, Agent, or Firm—Gregory A. Cone

[57] ABSTRACT

A series of segments of a parent aspheric mirror having one foci at at a quasi-point source of radiation and the other foci at the radius of a ring field have all but one or all of their beams translated and rotated by sets of mirrors such that all of the beams pass through the real entrance pupil of a ring field camera about one of the beams and fall onto the ring field radius as a coincident image as an arc of the ring field.

18 Claims, 5 Drawing Sheets

CONDENSER FOR ILLUMINATING A RING FIELD

The government has rights to this invention pursuant to Contract No. DE-AC04-76DP00789 awarded by the Department of Energy.

BACKGROUND OF THE INVENTION

This invention relates to condensers that collect radiation and deliver it to a ring field. More particularly, this condenser collects radiation, here soft x-rays, from a small, incoherent source and couples it to the ring field of a camera designed for projection lithography.

Projection lithography is a powerful and essential tool for microelectronic processing. As feature sizes are driven smaller and smaller, optical systems are approaching their limits caused by the wavelengths of the optical radiation. Soft x-rays are now at the forefront of research in the efforts to achieve the desired feature sizes. This radiation has its own problems however. The complicated and precise optical lens systems used in conventional projection lithography do not work well for a variety of reasons. Chief among them is the fact that most x-ray reflectors have efficiencies of only about 60%. This alone dictates very simple beam guiding optics with very few surfaces.

One approach has been to develop cameras that use only a few surfaces which can image with acuity only along a narrow arc or ring field 48. Such cameras then use the ring field to scan a reflective mask 46 and translate that onto the wafer 16 for processing. Although cameras can be designed to do this, there is as yet no available condenser system which can efficiently couple the soft x-rays from a source to the ring field required by this type of camera.

Further, full field imaging, as opposed to ring field, requires severely aspheric mirrors. Such mirrors cannot be manufactured to the necessary tolerances with present technology for use at these wavelengths.

SUMMARY OF THE INVENTION

A series of aspheric mirrors on one side of a small, incoherent source of radiation produces a series of beams. If the mirrors were continuously joined into a parent mirror, they would image the quasi point source into a ring image at some radial distance, here some number of feet. Since only a relatively small arc (about 60 degrees) of the ring image is needed by the camera, the most efficient solution is to have all of the beams be so manipulated that they all fall onto this same arc needed by the camera. Also, all of the beams must be aimed through the camera's virtual entrance pupil. These requirements are met in two steps.

First, the beams are individually rotated and translated, as necessary, using mirrors so that they overlap at the ring field and pass through the real entrance pupil without interfering with each other. The second step is to image this real entrance pupil into the camera's virtual entrance pupil using a powered imaging mirror. This places the corrected, combined images of the mirrors into the proper position for use by the camera. This system may be configured in a variety of ways, two of which are explained below.

Although this condenser was initially designed for use with soft x-rays, it is also suitable for use with any other lithographic system that uses a small, bright source of radiation with a ring field camera with modifications that are well within the ordinary skill those working in this technical area.

DETAILED DESCRIPTION OF THE INVENTION

This system may be configured in a variety of ways by varying the mirror configurations and in other ways as well. One of the primary advances herein is the ability to separate the light from a quasi point source into several equal arcs that are then superimposed on each other at the ring field radius, thus maximizing the collection efficiency of the condenser. The scope of this invention should not be limited to these specific embodiments but rather be defined by the claims.

Both embodiments are designed to use a laser plasma source of soft x-rays that radiates at 14 nm. The diameter and height of the source is specified as about 150 $\mu$m. The camera at the other end of the system images a 60 degree, 125 mm long by 5 mm wide ring field onto the wafer at 5× reduction. The entrance pupil is 3.6 m behind the reflective object mask, and the numerical aperture of the camera is n.a.=0.08.

Figure 1:
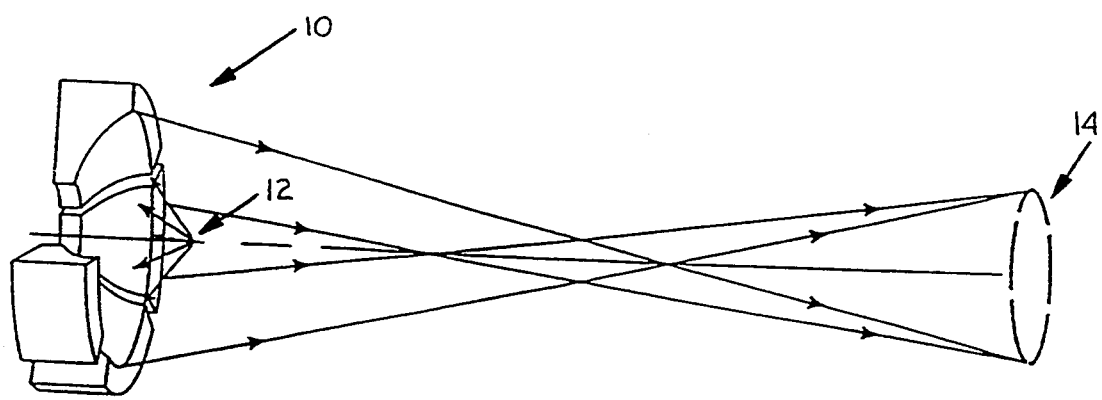
FIG. 1 is a side view of one embodiment of the system without correcting mirrors, showing the reimaging of the point source into a ring field with the images crossing over the centerline of the system.

Turning to the first embodiment of this system, the illuminator or collecting mirrors are composed of five off-axis segments of an aspheric mirror, each 60 degrees wide, producing five beams which each cross over the system axis or centerline 11 as defined by the source and the center of the parent mirror. The parent aspheric mirror 10 images the "point" source 12 into a ring image 14 as shown in FIG. 1. Therefore, its cross-section in the r–z plane is elliptical with one of the foci at the plasma source and the other at the ring field radius. Each of the 60 degree mirror segments images the source into a 60 degree segment of the ring image. Four of the five segments are shown in FIG. 1.

Figure 2:
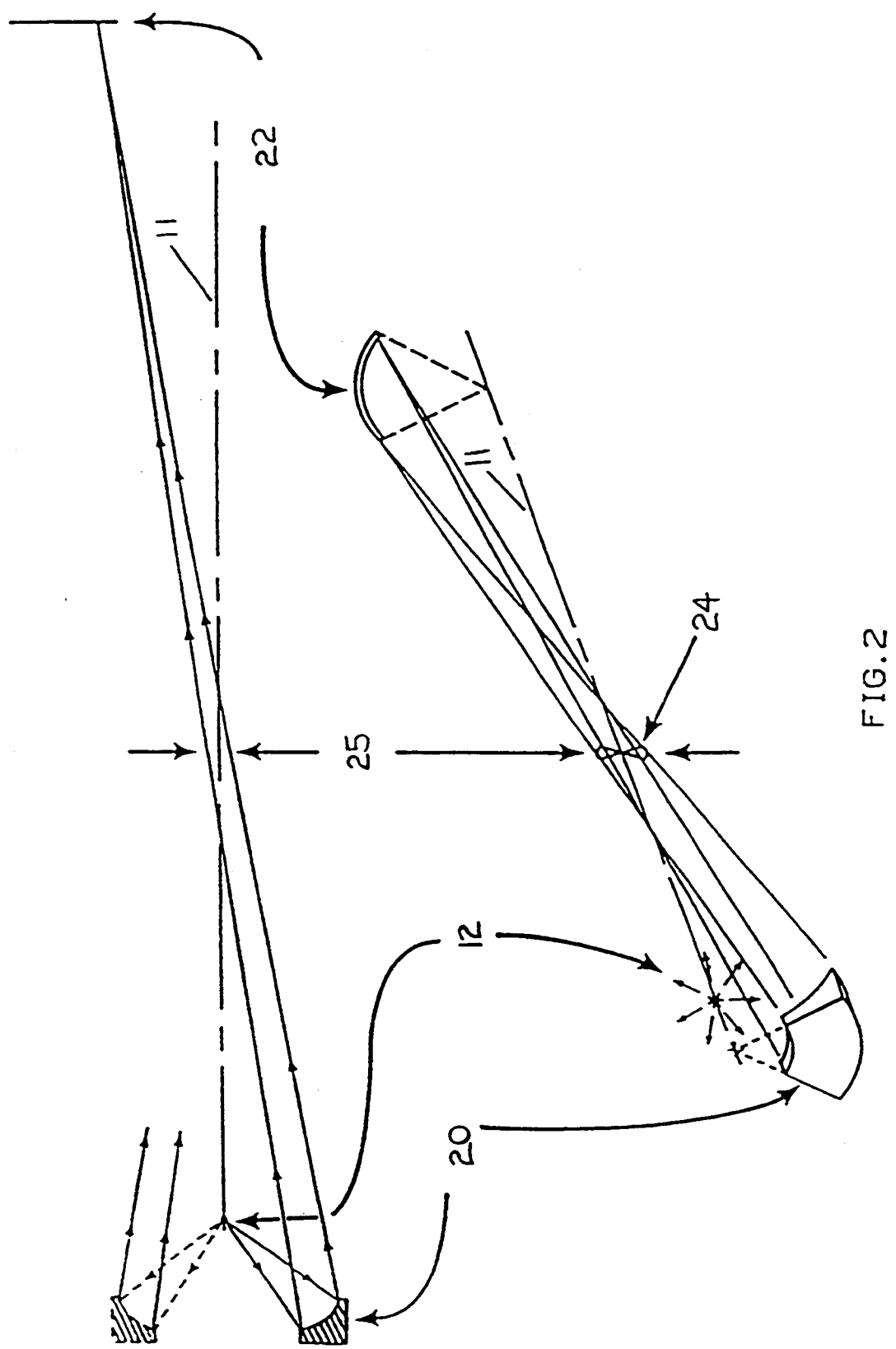
FIG. 2 is another side view showing the geometries of the mirrors and the beams in more detail for this embodiment.

FIG. 2 shows both a side view and an isometric view of the beam from one segment 20 of the aspheric mirror, with the isometric view rotated relative to the side view about a line 25 passing through the area of the beam having a smallest beam cross section. It shows the shape of the collector mirror 20, the arc image 22, and the bow-tie-shaped minimum beam cross-section 24, which is located at the center of the axial line focus. This design gives uniform illumination and image quality along the length of the arc 22.

Figure 3:
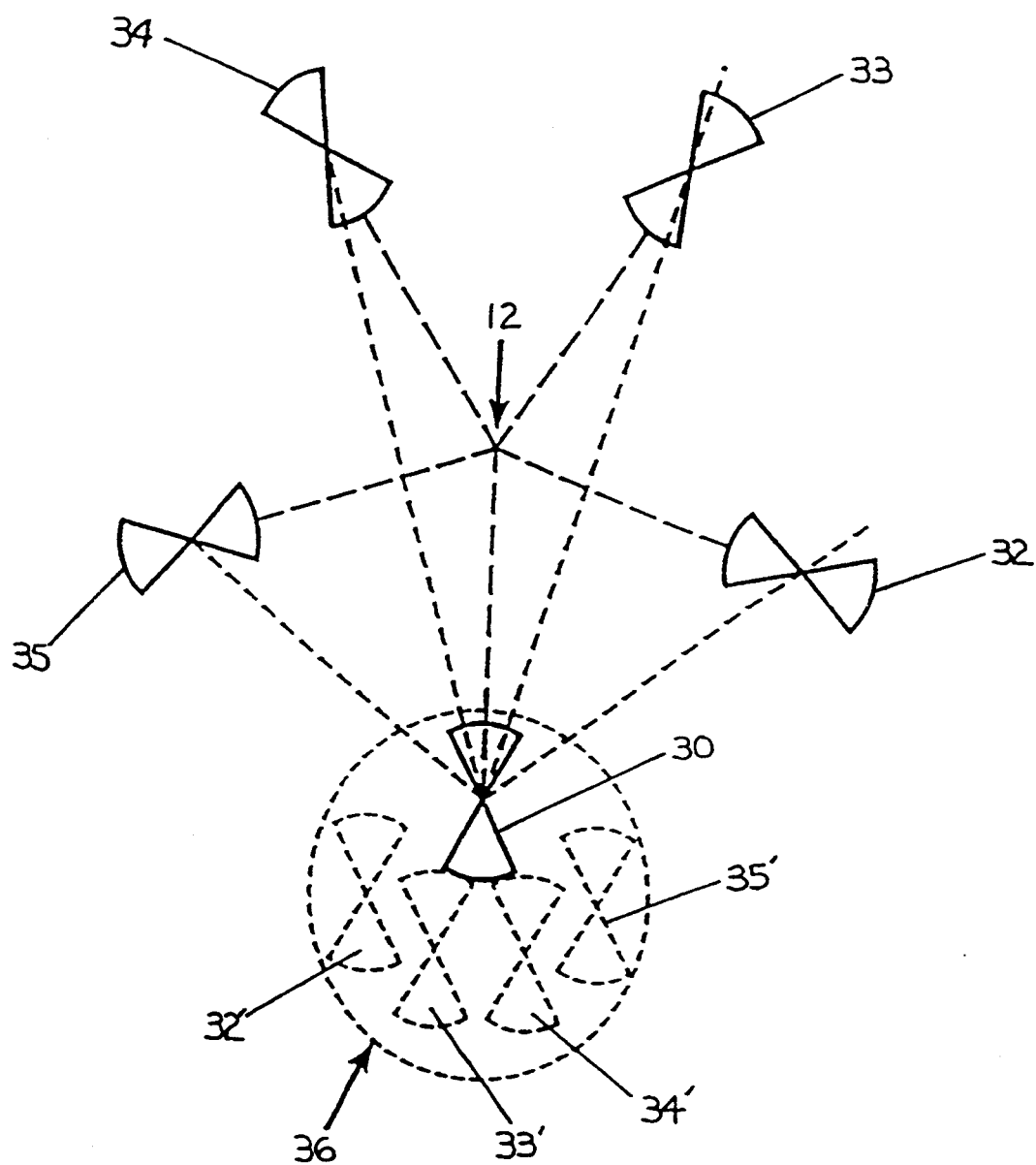
FIG. 3 is an end view of the multiple beams in the plane of the entrance pupil both with and without rotations and translations caused by the correcting mirrors.

The five beams need to be directed so that their 60 degree ring focus segments are all superimposed in the camera's 60 degree ring field. Furthermore, all five beams must be aimed through the camera's virtual entrance pupil 49. In this embodiment, four of the five beams are translated and rotated by individual sets of three Rhodium-covered grazing-incidence flat mirrors 41, 42 and 43 such that their images at the ring field radius fall onto that of the fifth beam, which was undeviated by the correcting mirrors. The correcting mirrors are arranged similarly to the reflecting surfaces in a conventional "K-prism." The three mirrors used here allow enough degrees of freedom to rotate and translate the ring focus segments so that they overlap at the ring field and pass the beams through the real entrance pupil without overlapping. FIG. 3 is an end view of the system showing the five beams in the plane of the entrance pupil of the camera in their narrowest, bow-tie forms, in their uncorrected positions in solid lines 30, 32, 33, 34, and 35 and in their translated and rotated positions 32', 33', 34', and 35' as shown in dotted lines. As can be seen, the bottom beam passes through the real entrance pupil 36 uncorrected while the other four beams are corrected by the K-mirror sets aligned in the various individual planes defined by the bow-tie centers at their uncorrected positions and the bow-tie center of the uncorrected beam 30. The five beams in the narrow, bow-tie forms efficiently fill the entrance pupil 36 without overlapping. A superior configuration is for the centers of the five bow-ties to fall onto an ellipse within the pupil rather than a circle as will be discussed below.

Figure 4:
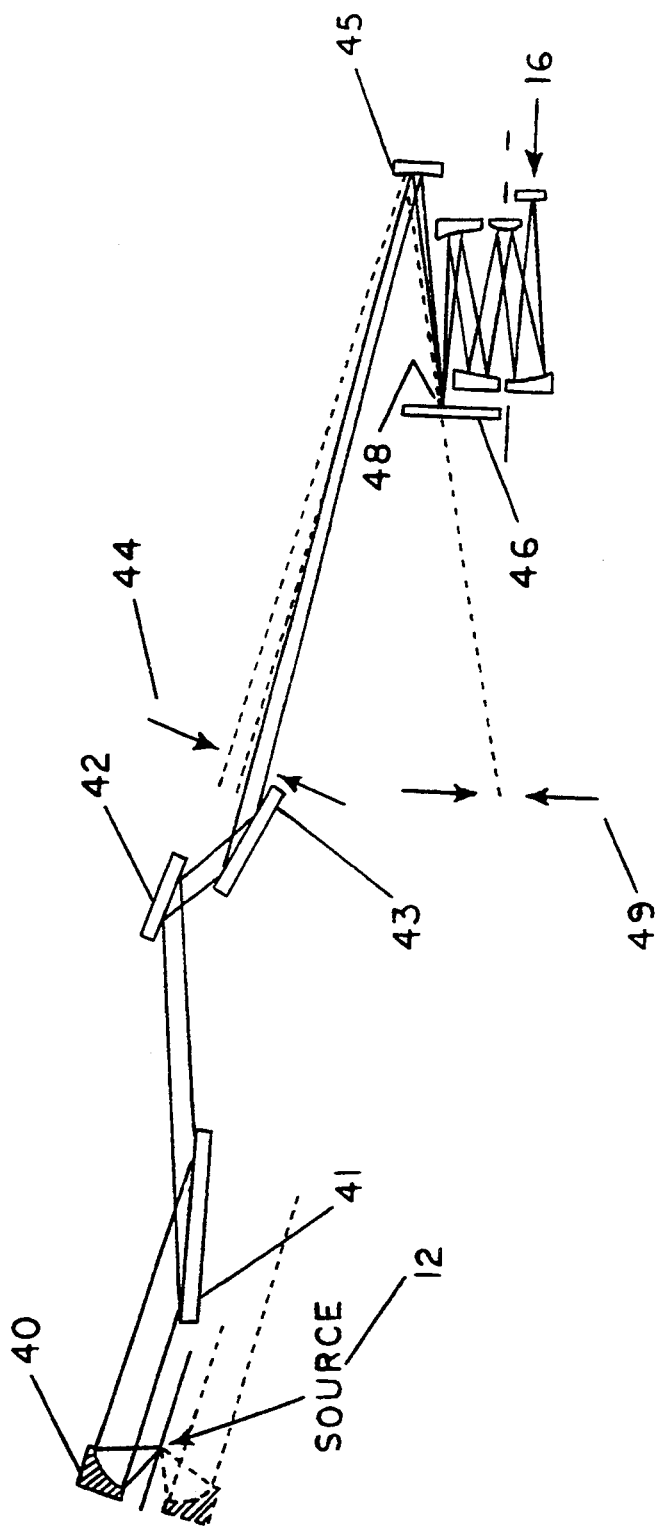
FIG. 4 is partial side view of the first embodiment of the system with one beam going through its set of correcting mirrors showing the interaction of this beam with the camera.

The overall layout of this embodiment for one beam can be seen in FIG. 4. The radiation is collected from the source 12 by one of the mirror segments 40. Its beam is then translated and rotated by the set of correcting K-mirrors 41, 42, and 43 and passed through the real entrance pupil 44 of the camera as shown. The beam is then reflected off the imaging mirror 45 and onto the reflective mask 46. The imaging mirror 45 here is shown as a reflecting sphere. Somewhat better efficiency can be achieved by use of another grazing-incidence mirror which will flip the beam out to the right rather than fold it back as shown here. In this manner the condenser system delivers the five overlapped ring field segments at the ring field radius 48 which falls onto the reflective mask 46.

System efficiency is a function of the size of the source and the reflectivity of the mirrors. The collection efficiency depends on the Entendu of the whole optical system. The Entendu or Lagrange invariant derived from the theorum of conservation of energy and indicates that, for an unvignetted pencil of light, the product of image height and numerical aperture is the same at all image planes in the system. This leads to an equivalence between source parameters (diameter and collection angle) and camera parameters (ring field width and numerical aperture). If one were to illuminate the ring field with only one beam, one could use the entire numerical aperture for it. However, with five beams one can only use about one fifth of the entrance pupil area for each beam. Thus, the camera parameters together with the 150 μm source size limit the beam collection angle to about 50 degrees in elevation (and by 5×60 degrees=300 degrees in azimuth). This results in a total collection efficiency of about 50%.

The transmission efficiency of the beam lines depends on the reflectivity of the mirrors. At 14 nm, the theoretically perfect reflectivities are 56%, 82%, 65%, 82%, and 82%, where the first number is the average reflectivity of the aspheric collector, the next three are for the grazing-incidence flats at various tilt angles, and the last is for the reimaging sphere. The product of these ideal reflectivities is 20%, which means that theoretically, 10% of the soft x-rays from the source can be delivered to the mask. With real reflectivities, one can expect more on the order of 7% to be delivered.

Each segment of the parent mirror is astigmatic, having different circumferential and tangential focal planes. The circumferential image is the on-axis line focus shown in FIG. 2. This line is centered in the real entrance pupil, essentially giving Kohler illumination along the ring field. The tangential image (in the r–z plane) is located at the ring field, giving critical illumination. In a normal, non-scanning system this would give intensity and image quality variations in the radial direction. However, the scanning integrates out these radial variations. Hence, one is left with the uniform image quality which can only be achieved with Kohler illumination in a non-scanned system.

Partial coherence in the illumination affects the image quality. In an incoherently illuminated optical system, small features are attenuated due to the fall-off of the modulation transfer function (MTF). Partial conherence can be introduced into the illumination to counter this attenuation. This normally done by underfilling the entrance pupil in a system with Kohler illumination. Put a different way, the source (which is usually a disk) is imaged into the entrance pupil, and this image is smaller than the pupil by a factor of $\sigma \approx 0.6$. This value of $\sigma$ is a reasonable compromise which amplifies the small features and does not add too much "ringing" to the larger features.

The entrance pupil illumination for this embodiment is shown in FIG. 3. It is obviously not a disk; rather, it is five bow-tie beam cross-sections arranged in a circle. Although the imaging of this system has not been analyzed in detail, study has been made of a five point pattern where the points are symmetrically located on a circle. It is interesting that this illumination pattern creates an image almost identical to a disk with $\sigma \approx 0.5$. This similarity between the disk and the five point pattern implies that the five-fold symmetry is a very serendipitous choice. In this embodiment, there are five line sources in the entrance pupil, rather than five points. If their centers were located symmetrically on a circle, there would be some variation in the effective $\sigma$ value for features oriented radially or circumferentially. However, these variations can be removed by locating the line sources on an ellipse rather than on a circle.

Figure 5:
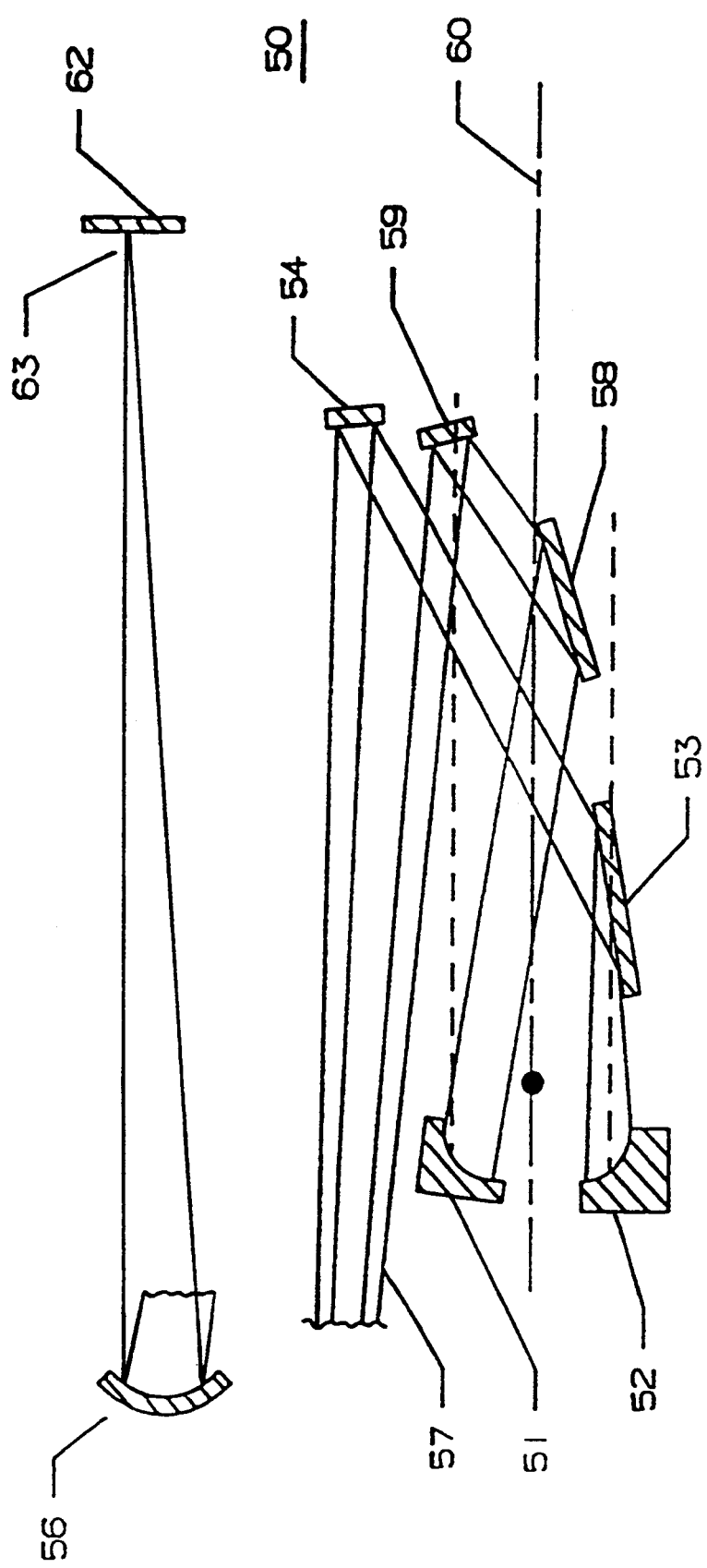
FIG. 5 is a side view of another embodiment of the invention with a different mirror configuration.

Further investigations of the invention resulted in another embodiment 50 which is illustrated in side view in FIG. 5. Here all, 52 et al., but one of the aspheric mirror segments are aligned to transmit their beams in parallel to the system centerline 60. The one remaining mirror segment 51 is tilted down towards the centerline 60 as shown in order to divert its beam 57 away from the correcting mirrors 53 and 54 et al. used on the other four segments. This unrotated beam 57 is translated by its two mirror set 58 and 59 to get around the correcting mirror sets for the other four rotated beams. The three-mirror sets used for rotation and translation for the first embodiment are here replaced with steeply tilted roof mirror pairs 53 and 54, and corresponding other pairs for the other beams which are not shown in this view. They do the same job but remove one reflective surface from the system and fold the beam line back onto itself. If a spherical imaging mirror 56 is employed as shown, the beam line can be folded back once more, resulting in a fairly compact configuration. By replacing the three mirror set which has reflectivities of 81%, 61%, and 81% with a two mirror set with reflectivities of 81% and 68%, the system efficiency can be improved up to about 25% with only a slight loss in bandwidth. The two mirror set used for translation and rotation is configured with the first mirror 53 tilted about 10 degrees from grazing and the second mirror 54 being a near-normal multilayer with similarly employed sets being used for the other translated and rotated beams. The two together act as an off-axis roof mirror which will rotate the image in the same manner as the K-mirror set used above. The four beams that are rotated still pass through the position of the unrotated beam. The multilayer mirrors tilt each beam up slightly so they miss the collector mirrors as they are folded back. The fifth beam 57 is not rotated, so its aspheric mirror segment can be tilted down slightly as shown. Once the beams have interacted with their respective two-mirror sets, the beams are handled as in the first embodiment. As with the first embodiment, the five beams are superimposed at the ring field radius 63 onto the mask 62. Any tilt errors remaining in the system can be easily nulled.

It is possible to make a number of modifications to the these two embodiments. For example one might rotate and translate all five beams at the risk of adding some complexity and loss to the system so long as all the beams still passed through a single real entrance pupil of the camera about one of the beams and ended up superimposed at the ring field radius. These and many other variations are possible. The true scope of the invention is to be found in the claims.

I claim:

1. A condenser system for use with a ring field camera comprising:
   a small diameter source of radiation;
   at least three substantially equal radial segments of a parent aspheric mirror, each having one focus at the radiation source and the other focus at the radius of a ring field and each producing a beam of radiation;
   a number of sets of correcting mirror means, each correcting mirror means comprising correcting mirrors which both translate and rotate, which is one less than the number of aspheric mirror segments, such that one of the beams, an unrotated beam of radiation passes through the real entrance pupil of the camera without interaction with a set of correcting mirrors to form a first segment of a ring image at the ring field radius and the other beams individually interact with one each of the respective sets of correcting mirrors wherein each of the other beams is individually rotated and translated into substantial coincidence with the first segment at the ring field radius.

2. The system of claim 1 wherein each of the rotated and translated beams passes through the entrance pupil of the camera about the one unrotated beam.

3. The system of claim 1 wherein each of the rotated and translated beams passes through the real entrance pupil of the camera about the one unrotated beam without interferring with another beam.

4. The system of claim 1 wherein the correcting mirrors are located in the beamline between the aspheric mirror segments and the real entrance pupil of the camera.

5. The system of claim 1 wherein the radiation comprises soft x-rays.

6. The system of claim 1 wherein there are five aspheric mirror segments, each of which images about 60 degrees of arc at the ring field radius.

7. The system of claim 1 further including powered imaging mirror means acting upon the one uncorrected and the other corrected beams to locate the combined coincident position of the beams at a specific position at the ring field radius.

8. The system of claim 7 wherein the specific position is onto a reflective mask.

9. The system of claim 1 wherein the correcting mirrors are sets of three grazing-incident mirrors each.

10. The system of claim 1 wherein the correcting mirrors are sets of two mirrors arrayed as roof mirror pairs.

11. The system of claim 10 wherein the uncorrected beam is translated by a set of two mirrors arrayed as a roof mirror pair.

12. The system of claim 1 wherein the aspheric mirror segments reflect their beams through the system centerline.

13. The system of claim 9 wherein the aspheric mirror segments reflect their beams through the system centerline.

14. The system of claim 11 wherein the aspheric mirror segments reflect all their beams but one parallel to the system centerline.

15. The system of claim 1 wherein all the beams are at or near their minimum cross-sections at the point where they pass through the real entrance pupil of the camera.

16. A condenser system for use with a ring field camera comprising:
   a small diameter source of radiation;
   at least three substantially equal radial segments of a parent aspheric mirror, each having one focus at the radiation source and the other focus at the radius of a ring field and each producing a beam of radiation;
   a corresponding number of sets of correcting mirror means which are capable of translation or rotation or both such that all of the beams of radiation pass through the real entrance pupil of the camera about one of the beams to form a coincident ring image at the ring field radius.

17. The system of claim 16 wherein the beams pass through the real entrance pupil without overlapping.

18. The system of claim 17 wherein all the beams are at or near their minimum cross-sections at the point where they pass through the real entrance pupil of the camera.

* * * * *